(12) United States Patent
Cao

(10) Patent No.: US 8,698,135 B2
(45) Date of Patent: Apr. 15, 2014

(54) PLASMA-CHLORINATED ELECTRODE AND ORGANIC ELECTRONIC DEVICES USING THE SAME

(71) Applicant: Xian-An Cao, Morgantown, WV (US)

(72) Inventor: Xian-An Cao, Morgantown, WV (US)

(73) Assignee: West Virginia University, Morgantown, WV (US)

( * ) Notice: Subject to any disclaimer, the term of this patent is extended or adjusted under 35 U.S.C. 154(b) by 0 days.

(21) Appl. No.: 13/803,398

(22) Filed: Mar. 14, 2013

(65) Prior Publication Data

US 2013/0240853 A1  Sep. 19, 2013

Related U.S. Application Data

(60) Provisional application No. 61/611,041, filed on Mar. 15, 2012.

(51) Int. Cl.
*H01L 29/786* (2006.01)

(52) U.S. Cl.
USPC .......... 257/40; 257/84; 257/89; 438/22; 438/98

(58) Field of Classification Search
USPC .......... 257/40, 84, 89; 438/22, 98
See application file for complete search history.

(56) References Cited

U.S. PATENT DOCUMENTS 7,468,285 B2 * 12/2008 Yamazaki et al. ........ 438/22
7,628,669 B2    12/2009 Liu

OTHER PUBLICATIONS

Faculty of Applied Science & Engineering, University of Toronto, "University of Toronto Researchers "Brighten" The Future of OLED Technology", Toronto, Ontario, Canada, Apr. 14, 2011.

Kuan Sun, Jianyong Ouyang, "Polymer Solar Cells Using Chlorinated Indium Tin Oxide Electrodes with High Work Function as the Anode", Solar Energy Materials & Solar Cells 96 (2012) pp. 238-243.

Z.Q. Xu, J. Li, J.P. Yang, P.P. Cheng, J. Zhao et al., "Enhanced Performance in Polymer Photovoltaic Cells with Chloroform Treated Indium Tin Oxide Anode Modification", Applied Physics Letters, vol. 98, 253303, (2011).

M. G. Helander, et al., "Chlorinated Indium Tin Oxide Electrodes with High Work Function for Organic Device Compatibility", Science, vol. 332, pp. 943-947, May 20, 2011.

M.G. Helander, Z.B. Wang, Z.H. Lu, "Chlorinated Indium Tin Oxide as a Charge injecting Electrode for Admittance Spectroscopy", Organic Electronics, vol. 12, pp. 1576-1579, 2011.

* cited by examiner

*Primary Examiner* — Roy Potter
(74) *Attorney, Agent, or Firm* — Thomas | Horstemeyer, LLP

(57) ABSTRACT

A method is disclosed for elevating the work function of conductive layers such as indium tin oxide by chlorine-containing plasma exposure or etching. Also disclosed are electronic devices such as organic light-emitting diodes and organic photovoltaic cells with a chlorine plasma-treated conductive layer as the hole-injecting or hole-accepting electrode. The performance of the devices is enhanced due to an increased work function of the plasma-treated electrode.

19 Claims, 13 Drawing Sheets

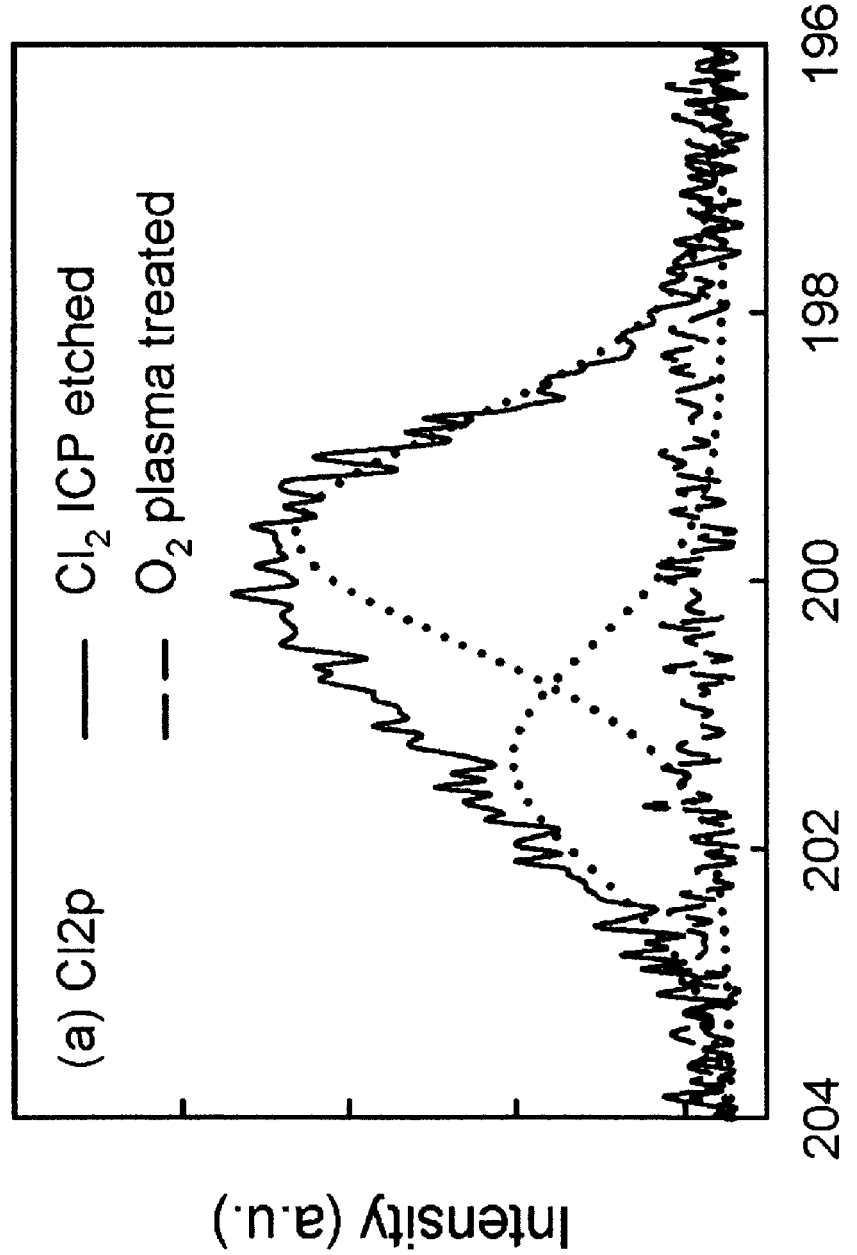

PLASMA-CHLORINATED ELECTRODE AND ORGANIC ELECTRONIC DEVICES USING THE SAME

CROSS-REFERENCE TO RELATED APPLICATION

This application claims priority to U.S. provisional application entitled "Plasma-chlorinated Electrode and Organic Electronic Devices Using the Same," having ser. No. 61/611, 041 filed on Mar. 15, 2012, which is entirely incorporated herein by reference.

BACKGROUND

The efficient and reliable operation of organic optoelectronic devices, such as organic light-emitting diodes (OLEDs) and solar cells, requires facile and balanced electron and hole transport between organic layers and electrodes. Large offsets between the work functions of the electrodes and energy levels of organic materials would cause high energy barriers for charge injection or acceptance, leading to high operation voltages, low quantum efficiency, and fast device degradation. State-of-the-art OLEDs suffer more from poor hole injection than electron injection. This is because the commonly-used hole-injecting electrode, indium-tin-oxide (ITO), has a work function about 4.7 eV, which is about 1 eV lower than the highest occupied molecular orbital (HOMO) of typical hole transport layer (HTL) and host materials. Considerable efforts have been devoted to the modification of the ITO/HTL interface for the enhancement of hole injection. The following three types of strategies are often adopted. (i) A thin organic interlayer, such as copper phthalocyanine (CuPc) and Poly(3,4-ethylenedioxythiophene)poly(styrenesulfonate) (PEDOT:PSS), is introduced between the ITO anode and HTL as a hole injection layer (HIL). The HIL has a HOMO between the Fermi level of ITO and HOMO of the HTL. Its addition thus creates a ladder-like energy structure that facilitates hole injection. (ii) A nanometer-thick inorganic insulator (mostly a metal oxide like $MoO_3$ and $Pr_2O_3$) is deposited on ITO to sustain a positive voltage drop, which effectively displaces the Fermi level of ITO downward. It can thus reduce the hole injection barrier. (iii) Surface treatments by plasma, ultraviolet ozone, and wet chemicals may be performed to modify the surface chemical states or introduce monolayer dipoles pointing toward the organic structure. In many cases, a simple treatment leads to an increase in the work function of ITO, and thus a reduced interfacial potential barrier.

Among different strategies, surface treatment is considered as the most convenient one because it can be easily incorporated into the OLED fabrication without adding structural complexity. Pretreatment of ITO with $O_2$ plasma is now widely used, often in conjunction with the addition of a HIL to improve hole injection in OLEDs. $O_2$ plasma not only effectively removes surface contamination, but also induces a Sn—O dipole layer, raising the work function of ITO by as much as 0.5 eV. However, the work function of $O_2$ plasma-treated ITO is still considerably lower than what is required for facile hole transport, particularly in short-wavelength OLEDs. Recently, Helander et al. developed a new treatment method which exposed ITO to o-dichlorobenzene vapor under UV radiation. The treatment raised the ITO work function from 4.7 eV to 6.1 eV, and enabled direct injection of holes into the light-emitting layer of a simplified green OLED. This approach, however, is not very compatible with OLED fabrication process. Furthermore, the treatment only creates relatively weak In—Cl bonds, which appear to be unstable. Organic solar cells fabricated on o-dichlorobenzene-treated ITO/glass were found to suffer rapid performance degradation.

SUMMARY

Embodiments of the present disclosure, in one aspect, relate to the field of electronic devices based on organic materials (including polymers). More particularly, embodiments of the present disclosure relate to a process of surface treatment of conductive layers used in organic electronic devices.

Briefly described, embodiments of the present disclosure include a method for producing an electrode for organic electronic devices comprising surface treatment of a surface of a conductive layer comprising exposing the conductive layer to a chlorine based plasma.

Embodiments of the present disclosure further include a method of making an organic electronic device comprising depositing a first conductive layer on to a substrate, treating the first conductive layer with a chlorine-based plasma, thereby increasing the work function of the first conductive layer by at least about 0.3 eV, depositing at least one organic layer over the first conductive layer, and depositing a second conductive layer over the at least one organic layer.

Embodiments of the present disclosure also include an organic electronic device comprising an electrode comprising a conductive layer, where the conductive layer is chlorinated by treatment with a chlorine based plasma, and where a work function of the conductive layer is increased by at least about 0.3 eV.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 9A-9B are graphs that illustrate XPS of (a) Cl2p and (b) In3d core level spectra of $O_2$ plasma-treated and $Cl_2$ ICP-etched ITO.

DETAILED DESCRIPTION

Figure 1:
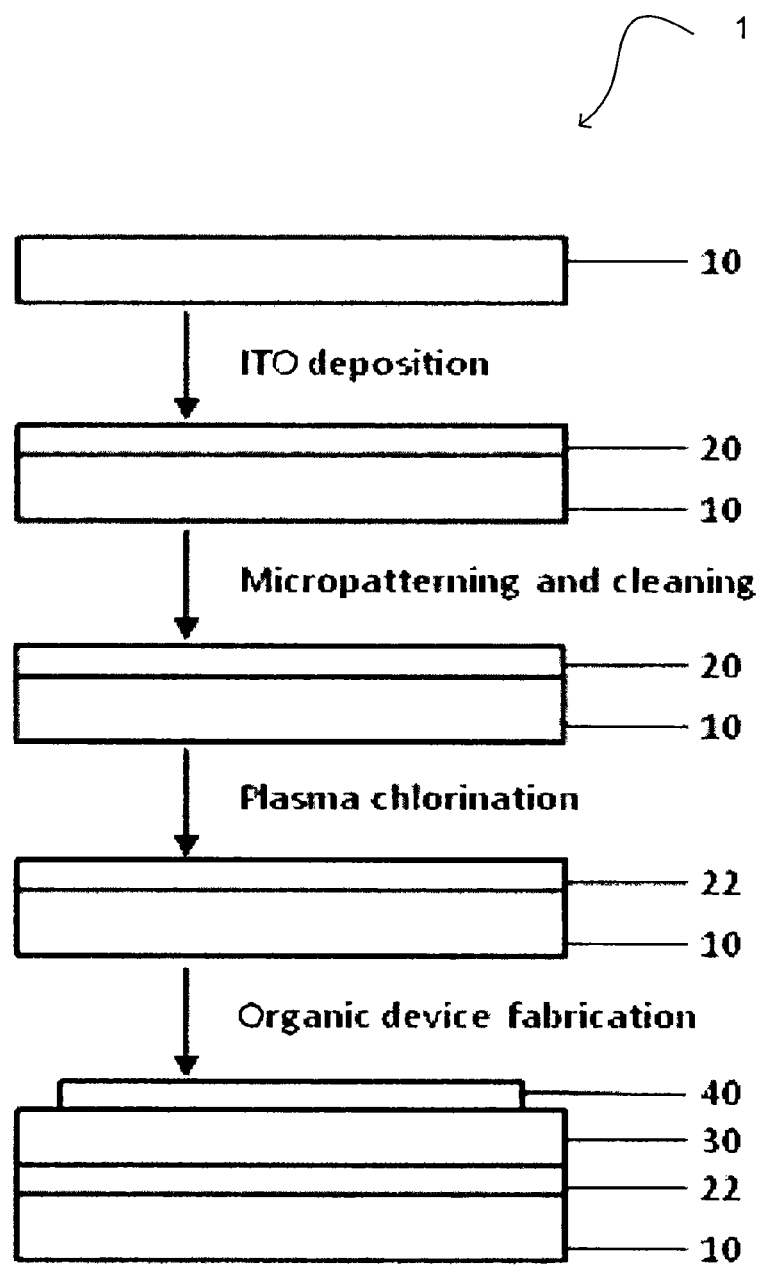
FIG. 1 illustrates process flow for fabricating an organic electronic device with a plasma-chlorinated ITO electrode in accordance with an embodiment of the present disclosure.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. While the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DEFINITIONS

As used herein, work function is the minimum amount of energy needed to remove an electron from a solid to a point immediately outside the solid surface. It is the energy needed to move an electron from the Fermi level of the solid to the vacuum energy level.

Discussion:

The present disclosure employs plasma of chlorine-based chemistries to treat the surface of conductive layers. This process creates robust Cl-metal polar bonds, remarkably elevating the work function of the conductive layers. Such a plasma-chlorinated conductive layer can be employed as the hole-injecting or hole-accepting electrode in organic electronic devices to achieve significant performance enhancement.

In one embodiment of the present disclosure, a conductive layer is exposed to a chlorine-based plasma with an average ion energy less than about 100 eV, and more preferably less than about 50 eV. The plasma-treated conductive layer is used in an organic electronic device as the hole-injecting or hole accepting electrode.

In another embodiment of the present disclosure, a conductive layer is briefly etched in a chlorine-based plasma. The plasma-etched conductive layer is used in an organic electronic device as the hole-injecting or hole accepting electrode.

An advantage of the present disclosure is that it provides a simple method compatible with organic device fabrication, for chlorinating the surface and increasing the work function of conductive layers, and for performance enhancement of organic electronic devices using such a conductive layer as the electrode.

The present disclosure includes a process which uses plasma based on chlorine-containing species to treat and thus modify the surface chemistry and properties of conductive layers. The present disclosure also includes a method for using such a conductive layer to enhance the performance of organic devices, including OLEDs, organic solar cells, organic laser diodes, organic photodetectors, etc. The conductive layers are typical materials used in organic devices as electrodes or charge-injection layers, including metals such as, but not limited to, Au, Pt, Ni, Cu, In, Sn, and Ag, transparent conductive oxides such as ZnO, $SnO_2$, indium tin oxide (ITO), indium zinc oxide (IZO), zinc tin oxide (ZTO), indium gallium zinc oxide (IGZO), and doped ZnO:Al (AZO), and other conductive or semi-conductive materials such as InP, InGaN, and graphene.

FIG. 1 shows a process 1 of surface treatment of a conductive layer and incorporation of the treated layer into an OLED device. A layer of a conductive material such as ITO 20 is first deposited on a substrate 10. The preferred methods for deposition of ITO include thermal evaporation, e-beam evaporation, and sputtering. The deposited ITO may be subjected to post-deposition annealing to improve its electrical conductivity and optical transparency. In the next step, the ITO layer 20 is micro-patterned using lithography and etching, as is known in the art. The sample is then cleaned using solvents and de-ionized water. The ITO surface may be further cleaned by exposing it to oxygen plasma or ultraviolet ozone, as is known in the art.

To chlorinate the clean ITO surface, the sample is exposed to a plasma based on one or more chlorine-containing species for a time greater than about 3 s up to about 10 min. Exemplary types of the plasma include, but are not limited to, high-pressure plasma, reactive-ion-beam plasma, inductively-coupled plasma, transmission coupled plasma, and electron cyclotron resonance plasma. Examples of the chlorine-containing chemistries include, but are not limited to, $Cl_2$, $BCl_3$, $CCl_4$, $SiCl_4$, $ClF_3$, $CClH_3$, and $C_xCl_yF_z$. In this process, the ion energy is kept below the threshold energy (typically about a few tens of eV) for etching so that no etching occurs, but high enough to promote the formation of metal-Cl bonding at the surface. The plasma treatment converts the ITO layer 20 to a plasma chlorinated ITO layer 22, terminated with a mixture of polar $In^+$—$Cl^-$ bonds and $In^{3+}$—$Cl^-$ bonds, which introduce a layer of dipoles pointing outward, raising the vacuum energy level and thus the ITO work function. The surface of layer 22 may also have Sn—Cl bonds, which may also contribute to the effect.

According to the present disclosure, an alternative way to modify the surface of the ITO layer 20 with chlorine-based plasma is to perform typical plasma etching using chlorine-based etching gases but keep the etching time short, on the order of a few seconds, to minimize the material loss. This can be achieved by adding a sufficiently high rf power to the sample holder to increase the ion energy. In an embodiment, a small amount of additive gases such as Ar, $H_2$ and $O_2$ may be added into the etching gas to facilitate the etching process. For example, as the average ion energy is raised to about 60 eV, ITO can be etched in about 20 mTorr $Cl_2/BCl_3$ (2:1 flow rate) inductively-coupled plasma at a rate of about 6 nm/min. Due to the low volatility of $InCl_x$ and $SnCl_x$, the etched ITO surface is covered by a layer of In and Sn chlorides. Thus, the plasma etching can also create a layer of dipoles comprising polar $In^+$—$Cl^-$ bonds and $In^{3+}$—$Cl^-$ bonds pointing outward, raising the vacuum energy level and thus the work function of the chlorinated ITO 22.

Organic device structure 30 is then deposited on the plasma-chlorinated ITO layer 22. In OLEDs and organic laser diodes, the ITO layer 22 is used as the hole-injecting anode, whereas in organic solar cells and photodetectors, it is used as the hole-accepting electrode. The device structure 30 typically comprises multiple layers of organic and hybrid materials. It can be deposited by vacuum deposition or solution processing such as spin-coating and inkjet printing, as is known in the art. An exemplary green OLED structure comprises a light-emitting layer which comprises a 4,4'-N,N'-dicarbazolebiphenyl (CBP) host doped with fac-tris(2-phenylpyridinato-N,C2') iridium (III) ($Ir(ppy)_3$)phosphorescent dyes, sandwiched between a 1,I-Bis((di-4-tolylamino)phenyl)cyclohexane (TAPC) hole transport layer and a 1,3,5-tris(2-N-phenylbenzimidazolyl)benzene (TPBi) electron transport layer. A hole injection layer which is required for hole injection in typical OLEDs is not needed here because holes can be readily injected from the high-work function chlorinated ITO 22 into organic layers. The OLED structure 30 may be further simplified by omitting the hole transport layer since holes may be injected directly into the emitting layer due to good energy level alignment between the chlorine plasma-treated ITO 22 and CBP. On the top of the device structure 30, a contact layer 40 is deposited as the second electrode. Examples of materials for the second electrode 40 include, but are not limited to Al, Ca and Ag/Mg.

The plasma treatment described herein may be used to modify the surface of other conductive layers and semi-conductive layers. The treated conductive layers may be used in different organic electronic devices (including hybrid devices comprising one or more organic layers) including laser diodes, solar cells and photodetectors for performance enhancement. The embodiments described herein are merely descriptive of the present disclosure and are in no way intended to limit the scope of the disclosure. Modifications of the present disclosure will become obvious to those having skill in the art in light of the description herein, and such modifications are intended to fall within the scope of the appended claims.

EXAMPLES

Example 1

Chlorine Plasma Exposure

Experiment

Two green phosphorescent OLEDs (peak wavelength about 517 nm) were prepared on glass substrates with pre-patterned ITO (sheet resistance about 80Ω/), which were subjected to different surface pre-treatments. For OLED A, the ITO/glass was solvent cleaned and then exposed to $O_2$ plasma for about 5 min. The substrate of OLED B was solvent cleaned, then exposed to $O_2$ plasma for about 5 min, and finally treated with $Cl_2$ ICP at about 20 mTorr for about 5 min. During the $Cl_2$ plasma treatment, the plasma energy was kept very low by applying a source power of about 50 W while setting the rf chuck power to zero, so the ITO was not etched. Both OLEDs had a simple structure, which comprised an about 30 nm 4,4'-N,N'-dicarbazolebiphenyl (CBP), an about 30 nm CBP doped with about 7 wt. % fac-tris(2-phenylpyridinato-N,C2') iridium (III) [$Ir(ppy)_3$], and an about 45 nm 1,3,5-tris(2-N-phenylbenzimidazolyl)benzene (TPBi) layer. Finally, an about 0.5 nm LiF/120 nm Al cathode was deposited through a shadow mask, which defined the active area of the OLEDs to be about 3×3 $mm^2$. The additional HIL and HTL normally used in typical OLEDs were eliminated, whereas an undoped CBP layer was included to facilitate charge capture and exciton generation. The HOMO of CBP is about 6.1 eV. If the surface treatment can bring the work function of ITO close to this energy level, holes can be directly injected into the light-emitting region. The OLEDs were encapsulated with glass lids in a $N_2$-filled glovebox and characterized at room temperature. To evaluate the device reliability, as-fabricated OLEDs was stressed at a constant current density of about 20 mA/$cm^2$ in air, and their EL and voltage were recorded about every 5 seconds. In addition, the surface chemistry of the treated ITO was analyzed using X-ray photoelectron spectroscopy (XPS). The changes in the surface work function of the ITO were measured by ultraviolet photoelectron spectroscopy (UPS), from the shifts of the low-kinetic energy secondary electron cutoff.

Results and Discussion

Figure 2:
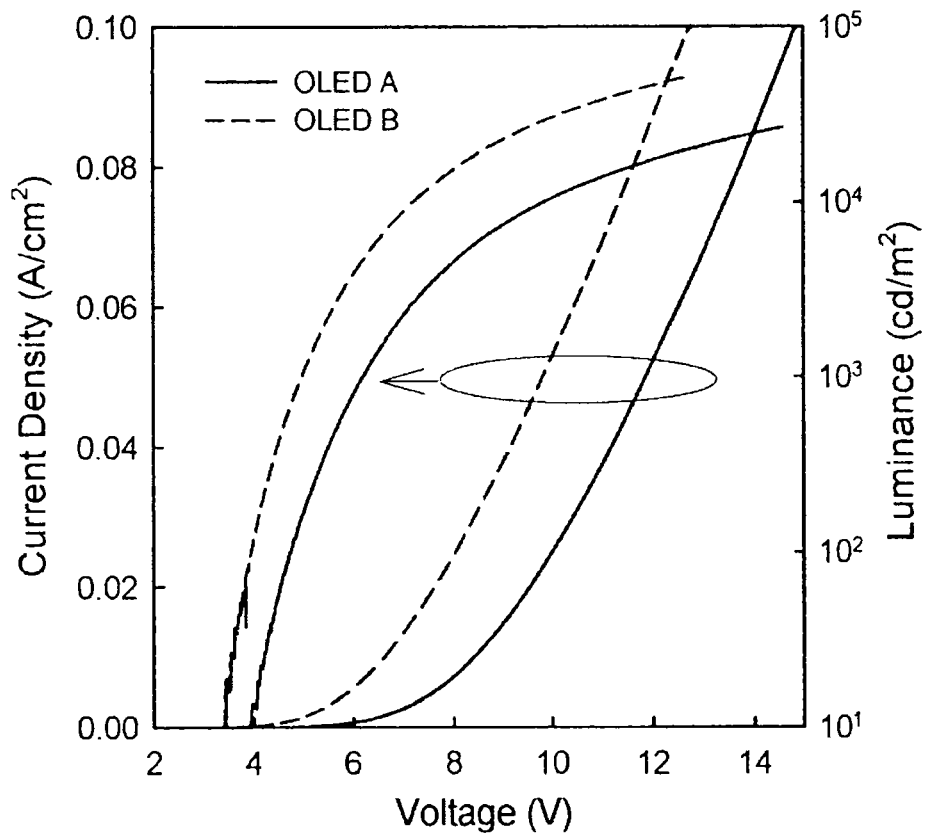
FIG. 2 is a graph that illustrates L-I-V characteristics of green OLEDs fabricated on ITO/glass with $O_2$ plasma (OLED A) and $Cl_2$ plasma (OLED B) pre-treatments.

FIG. 2 compares the luminance-current-voltage (L-I-V) characteristics of OLED A and B. At about 20 mA/$cm^2$, the voltages of OLED A and B are about 9.6 and 7.6 eV, respectively, whereas their respective brightness levels are about 9580 and 12380 cd/$m^2$. These results suggest that $Cl_2$ plasma is more effective than $O_2$ plasma in modifying the ITO surface for efficient hole injection in OLEDs. At the brightness of $10^4$ cd/m$^2$, OLED B has an about 30% higher current efficiency (about 74.1 cd/A) and an about 74% higher power efficiency compared to OLED A. The external quantum efficiencies (EQEs) of OLED A and B remain nearly constant in the injection range from about $10^{-4}$-$10^{-2}$ A/cm$^2$, at about 12.8% and 16.7%, respectively. At higher injection levels, the efficiencies drop gradually with increasing current in both OLEDs mainly due to current-induced quenching effects:[1,2] The time was varied for Cl$_2$ plasma treatment from about 10 s to 10 min. OLEDs built on those substrates showed similar L-I-V characteristics as OLED B. This finding indicates that an effective treatment in the Cl$_2$ ICP only takes a few seconds, making this technique very attractive for high-volume device production.

Figures 3A, 3B:
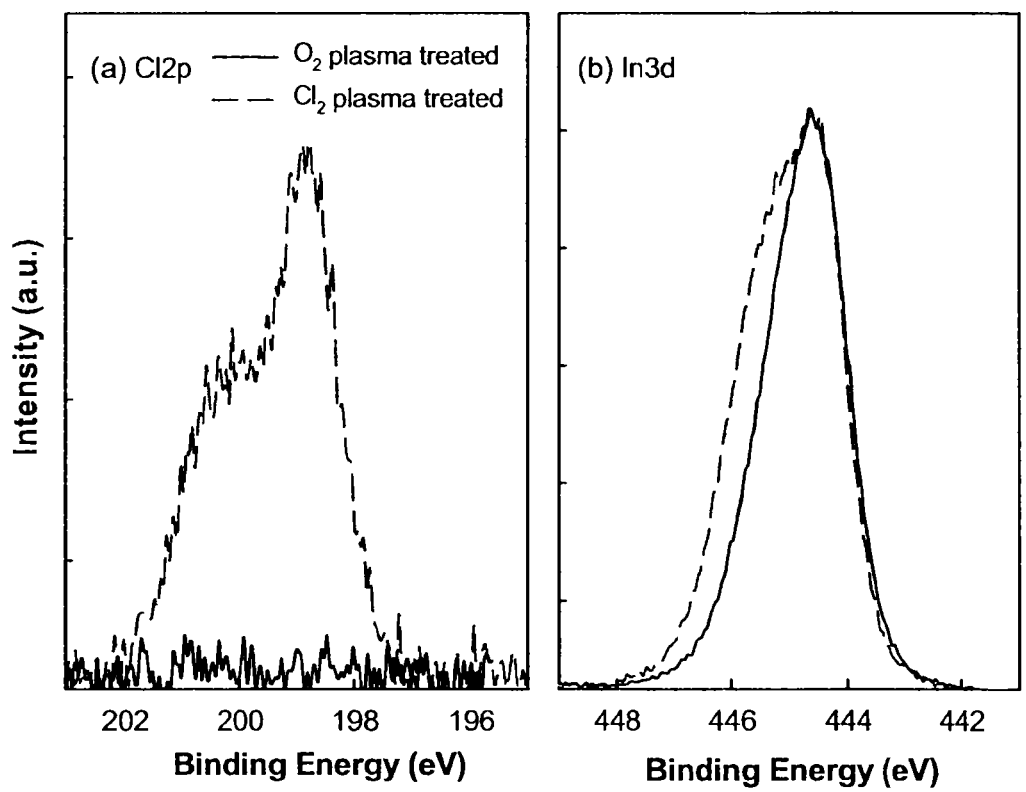
FIGS. 3A-3B are graphs that illustrate XPS of (a) Cl2p and (b) In3d core level spectra of ITO exposed to $O_2$ and $Cl_2$ plasma.

To gain insight into the mechanism underlying the performance improvement of the OLEDs resulted from Cl$_2$ plasma treatment, several treated ITO samples were examined by photoelectron spectroscopies. XPS scans have revealed that the surface chemistry of Cl$_2$ plasma-treated ITO is the same as that of O$_2$ plasma-treated ITO except for the addition of about 7-10 at. % Cl. The comparison of Cl$_2$p and In3d core level spectra of two different ITO samples is shown in FIGS. 3A-3B. The O$_2$ plasma-treated sample is free of Cl, whereas the Cl$_2$ plasma-treated sample shows a strong Cl2p signal comprising Cl2p$_{3/2}$ and Cl2p$_{1/2}$. The Cl/O atomic ratio is found to be about 1:5. The sampling depth of XPS is given by d=$3\lambda_e \cos \theta$, where $\lambda_e$ is the electron mean free path and $\theta$ is the average detection angle relative to the sample surface normal. At $\theta$=45°, d in ITO is on the order of about 4.9 nm,[3] about 4× of the lattice constant of ITO. Thus, the Cl surface coverage is no more than one monolayer. As seen in FIG. 3B, Cl$_2$ plasma treatment broadens the In3d core level band, which can be decomposed into two components corresponding to In—O bonds (about 444.7 eV) and In—Cl bonds (about 445.8 eV). Such spectral broadening was not observed in previous Cl vapor treatment.[4] It is plausible that vapor treatment only creates weak In$^+$—Cl$^-$ bonds that appeared to be unstable,[5] whereas plasma treatment creates a mixture of In$^+$—Cl$^-$ bonds (about 445 eV) and more stable In$^{3+}$—Cl$^-$ bonds (about 446.4 eV).[6] In addition, XPS showed no significant change in the In:Sn ratio after the Cl$_2$ plasma treatment.

Figure 4:
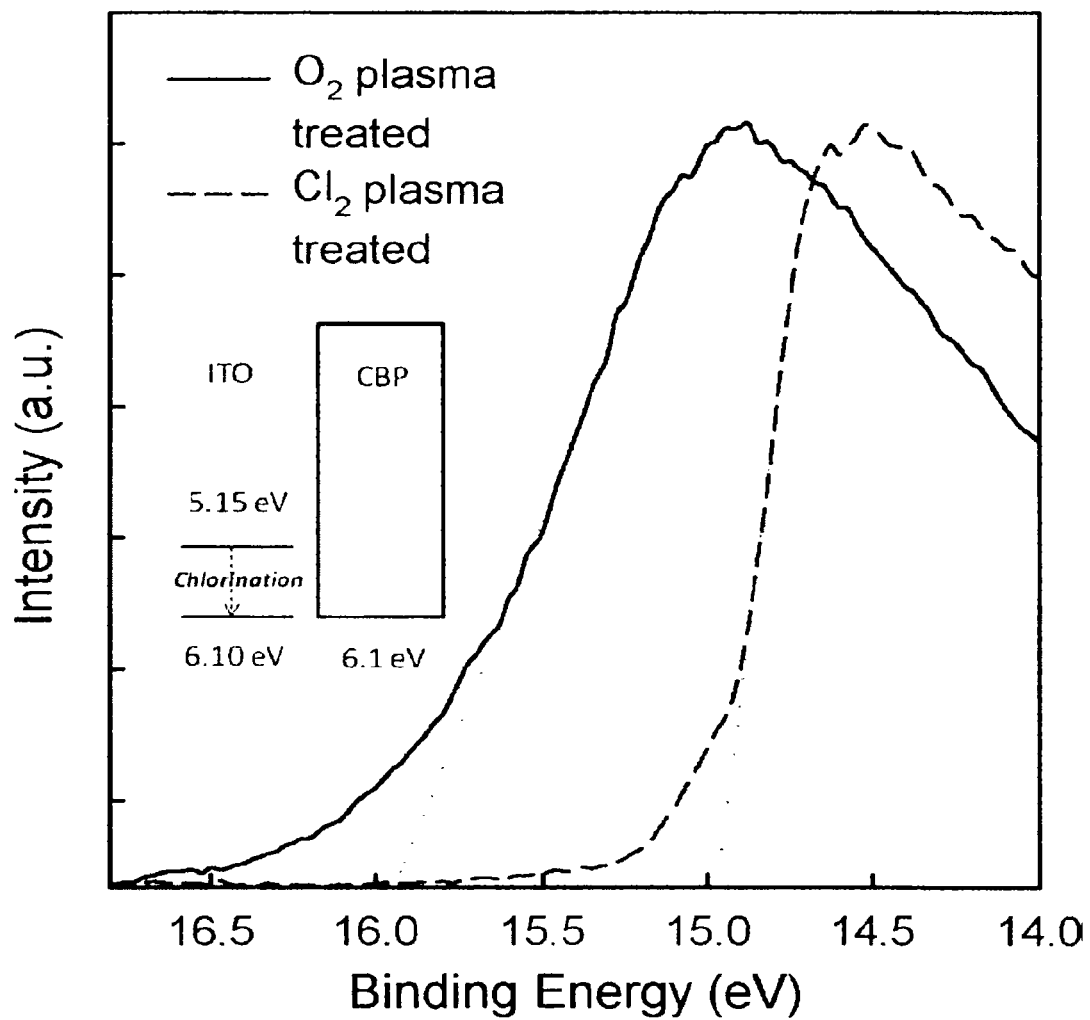
FIG. 4 is a graph that illustrates the secondary electron cutoff edges of the UPS spectra of ITO exposed to $O_2$ plasma and $Cl_2$ plasma. The inset shows the energy diagram of the ITO/CBP junction.

FIG. 4 shows the secondary electron cutoff of the UPS spectra of the ITO samples. The cutoff shifts toward the lower binding energy after exposure to Cl$_2$ plasma, indicating that Cl$_2$ plasma treatment can indeed raise the work function of ITO. The work functions of the O$_2$ plasma-treated and Cl$_2$ plasma-treated ITO were found to be about 5.15 eV and 6.10 eV, respectively. While these absolute values may not be accurate due to the lack of sharp Fermi level "steps" of ITO, the data clearly indicates a significant increase in the work function of ITO, by about 0.95 eV, after the Cl$_2$ plasma treatment. Based on the above XPS analysis, this increase in the work function can only be attributed to the formation of metal-Cl bonds. Therefore, these results support the theory that polar In—Cl bonds formed at the ITO surface introduce a layer of dipoles, which raises the vacuum energy level and thus the ITO work function. As seen in the inset of FIG. 4, the chlorinated ITO has a work function equal to the HOMO of CBP (about 6.1 eV). Thus, holes can be readily injected into the light-emitting region in OLED B, whereas the additional HIL and HTL normally used in similar OLEDs are not needed.

Figure 5:
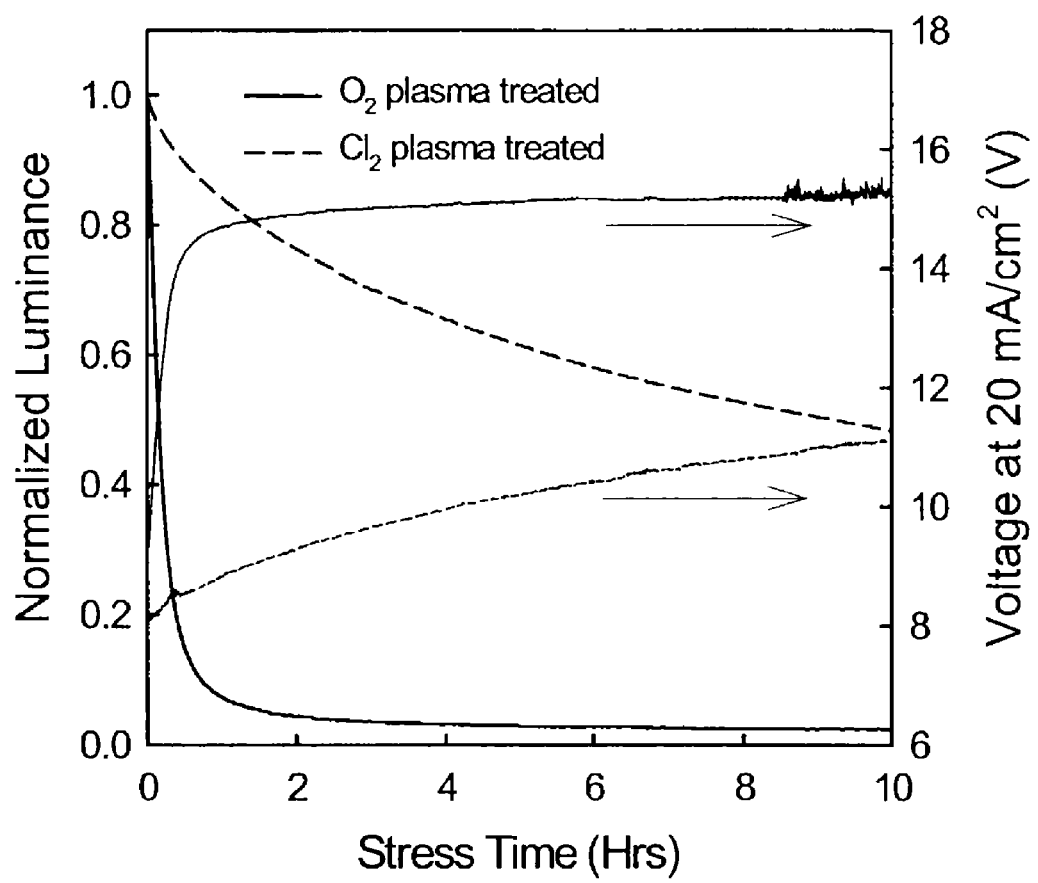
FIG. 5 is a graph that illustrates evolution of the normalized luminance and operation voltage of OLEDs fabricated on $O_2$ plasma and $Cl_2$ plasma treated ITO/glass under constant current stress at 20 $mA/cm^2$.

To evaluate the reliability of the OLEDs, as-fabricated devices were stressed in air at a constant current density of about 20 mA/cm$^2$. The dependence of the normalized luminance and operation voltage of the two OLEDs on the stressing time is plotted in FIG. 5. The EL intensity of OLED A drops dramatically during the first hour, by more than about 90%. This is accompanied by a rapid increase in operation voltage from about 9.5 V to 14.5 V. Both parameters tend to stabilize as the device is stressed further. As seen, OLED B displays gradual and much slower degradation. During the first hour, the EL decreases by only about 15% and its voltage increases from about 8.1 V to 8.8 V. The half-life (defined as the time for the brightness to decline to 50% of its initial value) of this OLED is found to be about 9.7 hours, about 61 times longer than OLED A. Similar evolution of dark spots in OLED A and B during storage has been observed. However, right before and after the stress tests, there were no noticeable changes in the size and density of dark spots in both OLEDs.

These findings indicate that Cl$_2$ plasma treatment can significantly improve the OLED reliability, but not by suppressing dark spots. Therefore, the aging behaviors must be caused by mechanisms other than reactions with atmosphere, such as crystallization of organic materials[7,8] and outdiffusion of indium.[9] OLED A clearly had an unoptimized structure and an initial operation voltage about 2.0 V higher than that of OLED B. The additional voltage likely drops at the ITO/CBP interface, producing a large amount of joule heat, which would accelerate crystallization in amorphous CBP. Defect states induced by the crystallites may act as carrier traps and recombination centers, leading to device degradation. This explanation agrees well with previous finding that better energy level alignment between ITO and the HTL leads to improved OLED stability.[10] The result in FIG. 5 may also be explained by different rates of indium outdiffusion from ITO, which has been identified as an aging mechanism in OLEDs under operation.[5] Since Cl—In bonds are stronger than In—O bonds, it is plausible that Cl can immobilize indium atoms more effectively and suppress their migration into the organic layer. These results indicate that Cl$_2$ plasma treatment creates a more stable ITO/organics interface than O$_2$ plasma treatment, leading to more reliable operation of the OLEDs.

Conclusions

In summary, it has been demonstrated that Cl$_2$ plasma treatment is a simple and effective method for surface modification of the ITO anode used in OLEDs and other organic electronics. The resultant chlorinated ITO had a work function about 0.95 eV higher than that of ITO treated with O$_2$ plasma, leading to more efficient hole injection into organic layers. At brightness about $10^4$ cd/m$^2$, OLEDs fabricated on Cl$_2$ plasma-treated ITO/glass had an about 30% higher EQE and an about 74% higher power efficiency compared to similar devices on O$_2$ plasma-treated substrates. It has also been found that Cl$_2$ plasma treatment created a more stable ITO/organics interface, which markedly improved the OLED half-life by a factor of about 61, presumably due to the suppression of material crystallization and/or indium diffusion at the ITO/organics interface. The developed dry plasma process is very compatible with the fabrication of various organic electronics and highly scalable for mass production.

References (which are incorporated by reference for the corresponding discussion):
1. G. Y. Zhong, Y. Q. Zhang, and X. A. Cao, Org. Electron. 11, 1338 (2010).
2. Y. Q. Zhang, G. Y. Zhong, and X. A. Cao, J. Appl. Phys. 108, 083107 (2010).
3. W. Song, S. K So, D. Wang, Y. Qiu, and L. Cao, Appl. Surf. Sci. 177, 158 (2001).
4. M. G. Helander, Z. B. Wang, J. Qiu, M. T. Greiner, D. P. Puzzo, Z. W. Liu, and Z. H. Lu, Science 332, 944 (2011).

5. K. Sun and J. Ouyang, Sol. Energy Mater. Sol. Cells 96, 238 (2011).
6. J. F. Moulder, W. F. Stickle, P. E. Sobol, and K. D. Bomben "Handbook of x-ray photoelectron spectroscopy: a reference book of standard spectra for identification and interpretation of XPS data," Physical Electronics, 1995.
7. D. F. O'Brien, P. E. Burrows, S. R. Forrest, B. E. Koene, D. E. Loy, and M E. Thompson, Adv. Mater. 10, 1108 (1998).
8. F. So and D. Kondakov, Adv. Mater. 22, 3762 (2010).
9. T. Lee, Z. Q. Gao, and L. S. Hung, Appl. Phys. Lett. 75, 1404 (1999).
10. C. Adachi, K. Nagai, and N. Tamoto, Appl. Phys. Lett. 66, 2679 (1995).

Example 2

Chlorine Plasma Etching

Experimental

Five types of green phosphorescent OLEDs, denoted as OLED A, B, C, D and E, were fabricated on glass substrates with pre-patterned ITO (thickness about 40 nm, sheet resistance about 80Ω/). Prior to device fabrication, the substrates were subjected to different surface pre-treatments. For OLED A, the ITO/glass was cleaned in sequence in acetone, ethanol, and de-ionized (DI) water. For OLED B, the ITO/glass was solvent and DI water cleaned, and then exposed to $O_2$ plasma for about 5 min. The substrate of OLED C and D were solvent and DI water cleaned, then exposed to $O_2$ plasma for about 5 min, and finally subjected to two different inductively-coupled plasma (ICP) etching steps. For OLED C, the substrate was etched in a $Cl_2$ plasma at about 300 W source power, about 25 W rf chuck power, about 20 mTorr pressure for about 30 sec. The etch rate was about 0.2 nm/s, and the etch depth was about 6 nm. For OLED D, the substrate was etched in a $Cl_2/BCl_3$ plasma at about 50 W source power, about 25 W chuck power, about 20 mTorr pressure for about 5 min. about 33 vol. % $BCl_3$ was added to the etching chemistry to facilitate the breaking of metal-O bonds by bombardment. Approximately 25 nm of ITO was etched. The dc self-bias was about −40 V during the etching, giving rise to an average ion energy of about 60 eV.[1] To compare the effects of plasma etching and exposure, we prepared OLED E whose substrate was exposed to a $Cl_2$ plasma for about 30 sec at a low source power of about 50 W and zero chuck power. During the treatment, the ion energy was below the value needed for bond breaking and the ITO was not etched.[2] All the treated substrates were then loaded into a high-vacuum thermal evaporator, where the organic layers and cathode were deposited by thermal evaporation. The OLED structure was comprised of an about 30 nm undoped 4,4'-N,N'-dicarbazolebiphenyl (CBP), an about 30 nm CBP doped with about 7 wt. % fac-tris(2-phenylpyridinato-N,C2') iridium (III) (Ir(ppy)$_3$), and an about 45 nm 1,3,5-tris(2-N-phenylbenzimidazolyl) benzene (TPBi) layer. The films were deposited at a rate of about 0.1 nm/s under a pressure of about $1\times10^{-7}$ Torr. Finally, an about 0.5 nm LiF and about 120 nm Al cathode were deposited on the organic film through a shadow mask, which defined the active area of the OLEDs to be about 3×3 mm$^2$.

The OLEDs were encapsulated with glass lids in a $N_2$-filled glovebox and characterized at room temperature. The electrical characteristics were measured using an Agilent 4156C semiconductor analyzer. The electroluminescence (EL) spectra were recorded as a function of injection current in the range of about $10^{-5}$-$10^{-2}$ A using a silicon photodiode-array fiber-optic spectrometer. To calculate external quantum efficiencies (EQEs), the OLEDs were placed directly onto the surface of a calibrated silicon photodetector and all emitted photons from the glass side were captured. To evaluate the device reliability, the OLEDs were stored in a glovebox for up to about 30 days and retested daily to evaluate their durability. The devices were also stressed at a constant current density of 20 mA/cm$^2$ in air, and their luminance and voltage were recorded about every 5 seconds.

Results and Discussion

Figure 6:
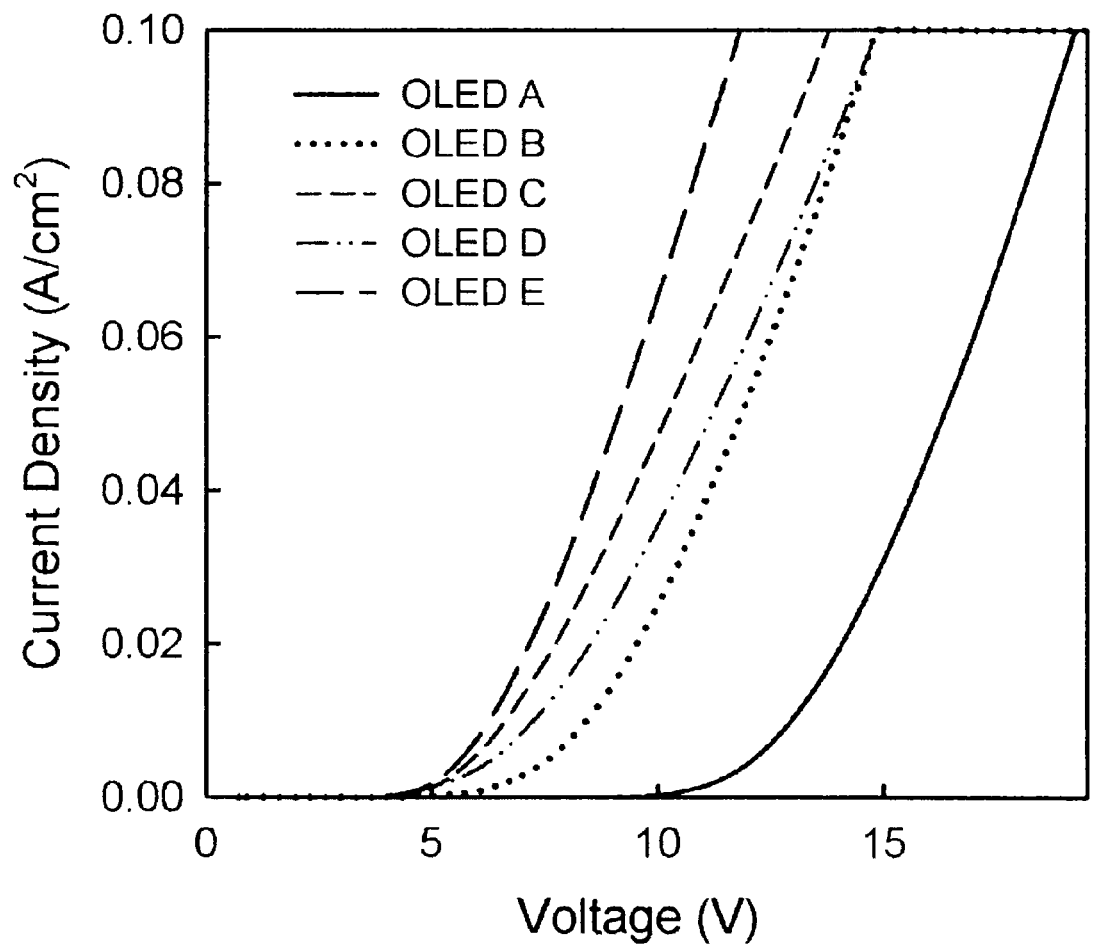
FIG. 6 is a graph that illustrates I-V characteristics of OLEDs fabricated on ITO/glass with different pre-treatments. OLED A: solvent cleaned; OLED B: $O_2$ plasma treated; OLED C: $Cl_2$ ICP etched; OLED D: $Cl_2/BCl_3$ ICP etched; OLED E: $Cl_2$ plasma exposed.

FIG. 6 compares the current-voltage (I-V) characteristics of these five OLEDs. In the OLED without plasma treatment (OLED A), there is an interfacial barrier about 1.4 eV for hole injection, so it is no surprise that the device has a very high operation voltage. OLED B with $O_2$ plasma-treated ITO has a much lower voltage, whereas $Cl_2$ plasma treatment leads to a further reduction in the voltage. As seen, OLED C, D, and E have a similar low turn-on voltage of about 5.0 V, as compared to about 6.3 V for OLED B and about 10.8 V for OLED A. This may be indicative of more efficient hole injection into the OLED structure from $Cl_2$ plasma-etched or exposed ITO. However, OLED C and D have higher series resistances compared to OLED E. At about 20 mA/cm$^2$, their voltages are about 7.7 and 8.5 V, respectively, higher than the voltage of OLED E (about 7.2 V). This is because the etched ITO layers are thinner and have higher sheet resistances, adding to the overall series resistance of the OLEDs. These results indicate that plasma etching is as effective as low-energy plasma exposure in modifying the ITO surface and reducing the turn on voltages of OLEDs. In order to avoid a significant increase in the series resistance, relatively thick ITO layers should be used and the etching time should be kept very short.

Figure 7:
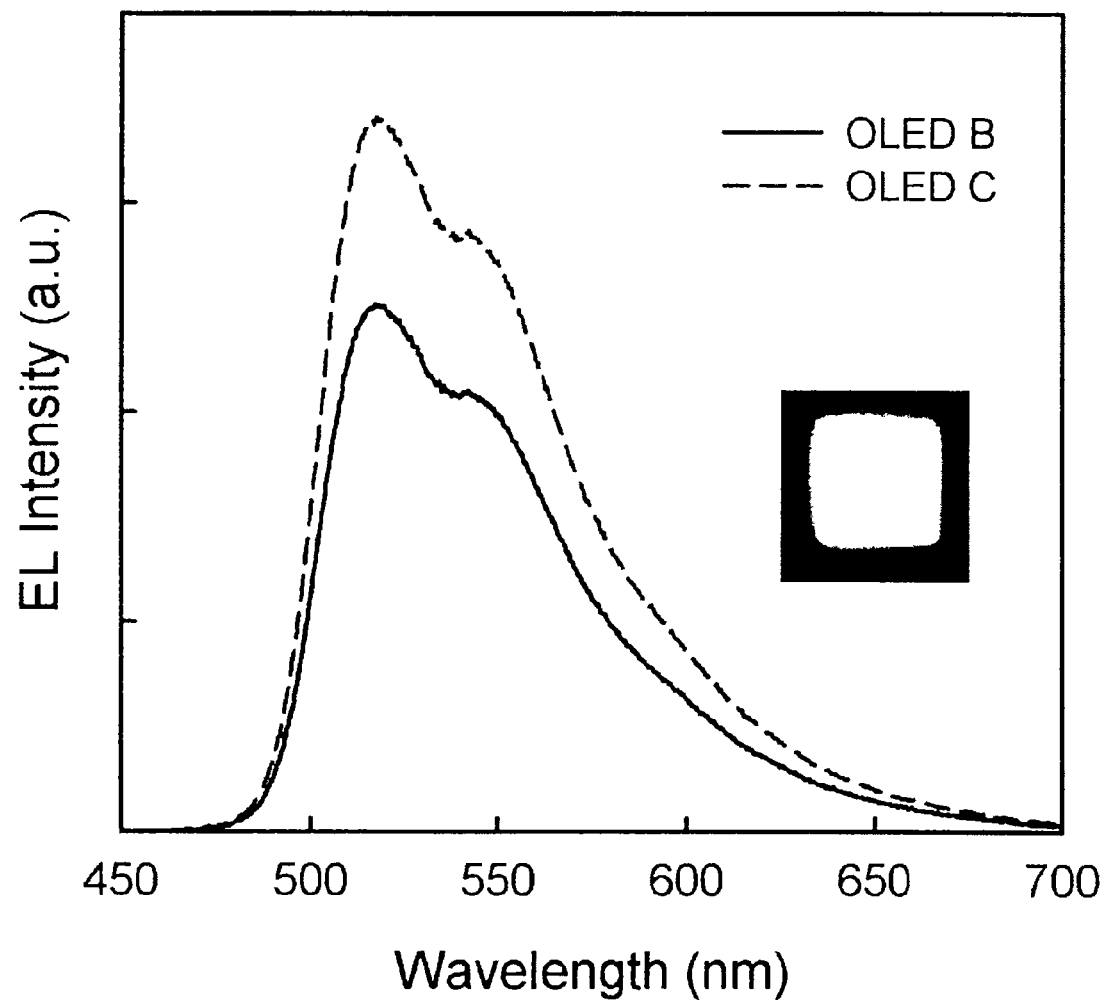
FIG. 7 is a graph that illustrates EL spectra of OLED B (with $O_2$ plasma treated ITO) and OLED C (with $Cl_2$ ICP etched ITO) at about 20 mA/cm². The inset shows a micrograph of OLED C at this current density.
Figure 8:
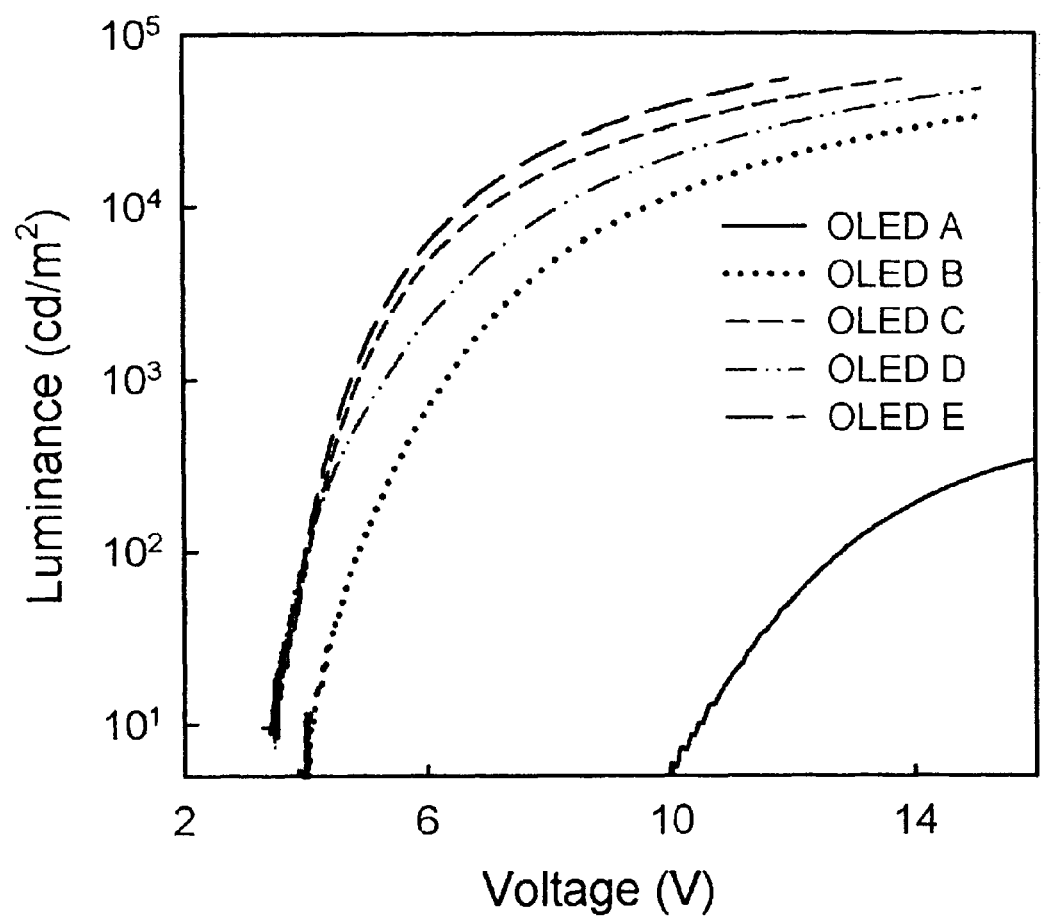
FIG. 8 is a graph that illustrates L-V characteristics of OLEDs fabricated on ITO/glass with different pre-treatments. OLED A: solvent cleaned; OLED B: $O_2$ plasma treated; OLED C: $Cl_2$ ICP etched; D: $Cl_2/BCl_3$ ICP etched; E: $Cl_2$ plasma exposed.

All the OLEDs showed the typical EL spectrum of Ir(ppy)$_3$ with a peak wavelength of about 517 nm. As seen from FIG. 7, the OLEDs with $O_2$ plasma-treated and $Cl_2$ ICP-etched ITO (OLED B and C) have identical EL features at about 20 mA/cm$^2$ except that the intensity of the latter is significantly higher. FIG. 8 compares the luminance-voltage (L-V) characteristics of these OLEDs, which display three important features. First, all the OLEDs with a plasma-treated ITO anode clearly outperform the OLED with untreated ITO. Second, $Cl_2$ plasma treatment leads to more pronounced performance enhancement than $O_2$ plasma treatment. At about 6 V, OLED E is about 9× brighter than OLED B. A brightness of about $10^4$ cd/m$^2$ is reached at about 6.7 V and 9.7 V for OLED E and B, respectively. At this brightness level, OLED E has an about 50% higher current efficiency and an about 118% higher power efficiency compared to OLED B. Third, as expected, at low voltages, the performance of OLED C and D is the same as that of OLED E. At high biases (greater than about 5 V), their luminances fall between those of OLED B and E. At about 20 mA/cm$^2$ (about 7.7 V), OLED C has a brightness of about $1.4\times10^4$ cd/m$^2$ and a current efficiency of about 70 cd/A, about 40% higher than those of OLED B.

Figure 9B:
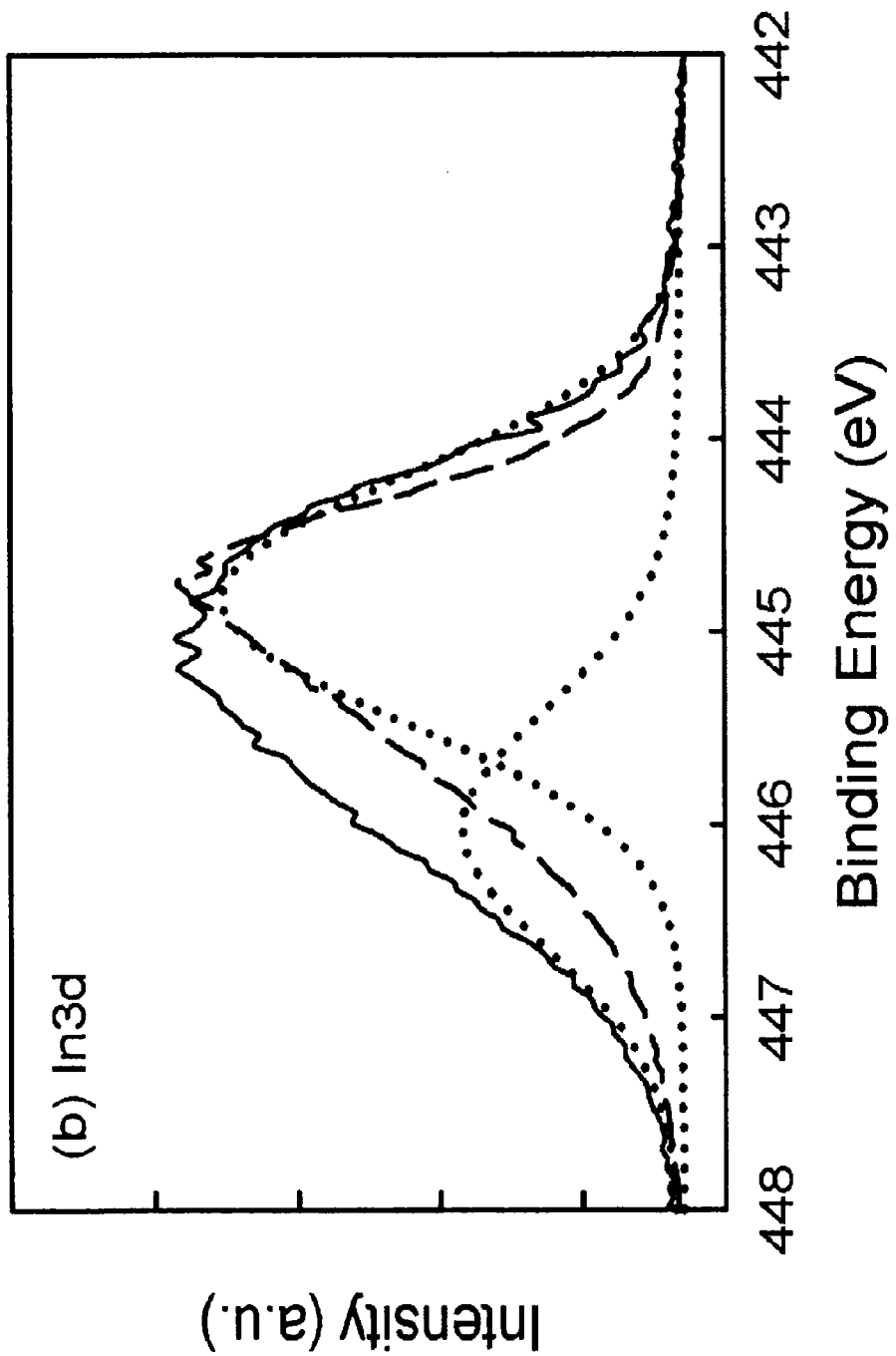

The surface chemistry of the ICP-etched ITO samples was examined by X-ray photoelectron spectroscopy (XPS) on a PHI 5000 Versa Probe system with a monochromatic Al Kα source (hv=1486.7 eV). Scans revealed that the $Cl_2$ ICP-etched ITO had the same surface composition as that of the $O_2$ plasma-treated sample except for the addition of about 7 at. % Cl. As seen in FIG. 9A, the $O_2$ plasma-treated sample is free of Cl, whereas the $Cl_2$ ICP-etched sample shows a strong Cl2p signal comprising Cl2p$_{3/2}$ and Cl2p$_{1/2}$. FIG. 9B shows the In3d core level spectra of two different ITO samples. $Cl_2$ ICP etching broadens the In3d core level band, which can be decomposed into two components corresponding to In—O bonds (about 445 eV) and In—Cl bonds (about 446 eV). Such In3d spectral broadening was not seen in previous vapor chlorination process, which likely only creates weak In$^+$—Cl$^-$ bonds that appeared to be unstable.[3] It is thus believed that plasma treatment, through low-energy plasma exposure or high-energy plasma etching, can create a mixture of In$^+$—Cl$^-$ bonds (about 445 eV) and stronger In$^{3+}$—Cl$^-$ bonds (about 446.4 eV), and therefore a more stable chlorinated ITO surface. These surface analyses confirm the incorporation of Cl into ITO during the Cl$_2$ ICP etching. We attribute this to the fact that, due to the low volatilities of the major etching products, i.e., InCl$_x$ and SnCl$_x$,[4] the etched ITO surfaces are covered by a layer of In and Sn chlorides.

Table I summarizes the atomic percentages of different elements on the surfaces of untreated, Cl$_2$ ICP etched and Cl$_2$ plasma exposed ITO wafers obtained by XPS. As seen, Cl$_2$ ICP etching resulted in the depletion of both In and Sn in the surface layer of ITO. The Sn/In atomic ratio was reduced from about 1:10 in the untreated sample to about 1:20, suggesting the relative higher volatility of SnCl$_x$ compared to InCl$_x$. The Cl$_2$ ICP etched has about 6.3% Cl, which is slightly lower than that on the Cl$_2$ plasma-exposed sample. The atomic ratio between Cl and O on the etched surface is only about 1:10. Considering that the X-ray penetration depth is several times greater than the lattice constant of ITO, we may conclude that the Cl surface coverage is less than one monolayer.

TABLE 1

Atomic percentages of different elements on the surfaces of untreated, Cl$_2$ ICP etched and Cl$_2$ plasma exposed ITO wafers obtained by XPS.

|  | O1s | Cl2p | In3d | Sn3d |
| --- | --- | --- | --- | --- |
| Untreated | 44.7 | 0 | 50.0 | 5.3 |
| Cl$_2$ ICP etched | 63.6 | 6.3 | 28.7 | 1.4 |
| Cl$_2$ plasma exposed | 40 | 8.5 | 48.3 | 3.2 |

Figure 10:
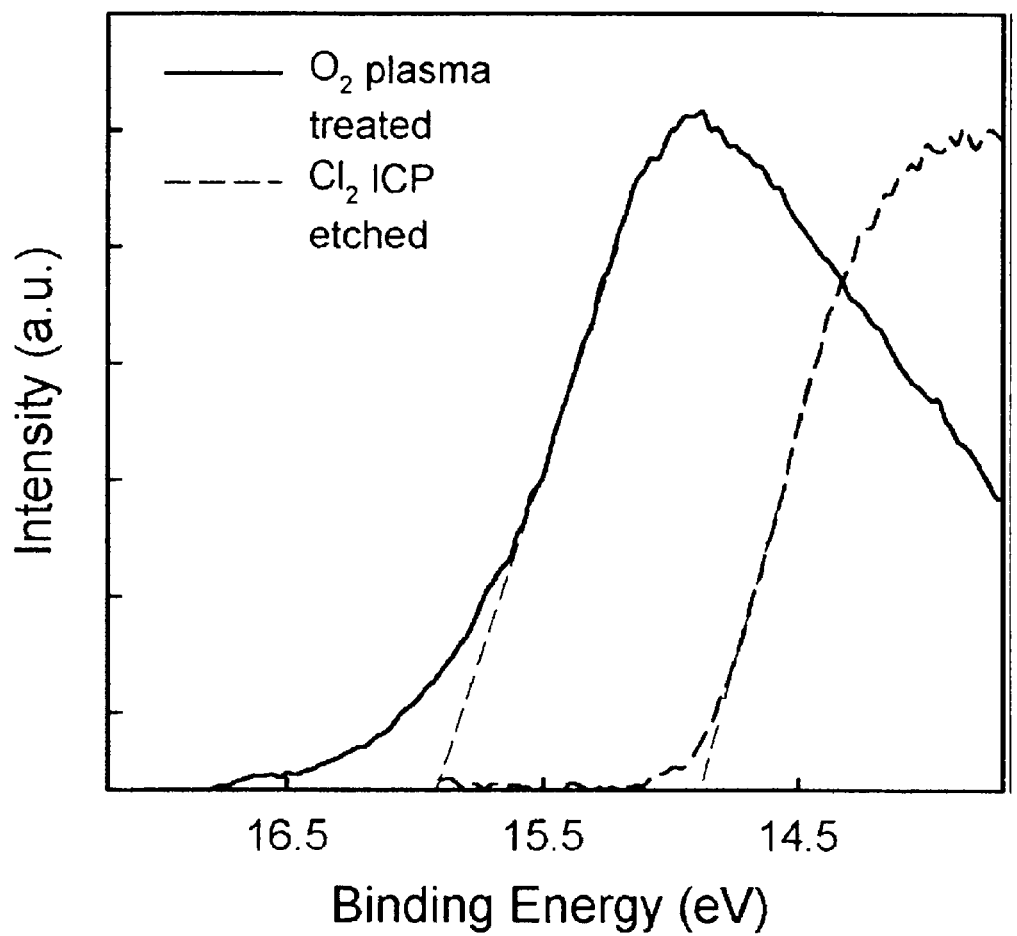
FIG. 10 is a graph that illustrates the secondary electron cutoff edges of the UPS spectra of $O_2$ plasma-treated and $Cl_2$ ICP-etched ITO.

In order to shed light on the mechanism underlying the performance enhancement resulted from Cl$_2$ ICP etching, the change in the work function of ITO was measured by ultraviolet photoelectron spectroscopy (UPS). The low-kinetic energy secondary electron cutoff of the UPS spectrum shifts toward the lower binding energy after Cl$_2$ ICP etching, confirming that the etched ITO has a higher work function. Various scans revealed energy shifts in the range of about 0.6-1.0 eV. FIG. 10 shows exemplary UPS spectra of ITO samples treated by O$_2$ plasma and etched by Cl$_2$ ICP. The work functions of the samples are estimated to be about 5.18 and 6.18 eV, respectively. The latter is comparable to the value previously obtained from Cl$_2$ plasma-exposed ITO.[2] While the absolute values may not be accurate due to the lack of a sharp Fermi level "step" of ITO, the data clearly indicates a significant increase in the work function of ITO after Cl$_2$ ICP etching. The higher work function is attributed to the formation of polar metal-Cl bonds, which introduce a dipole layer, and raise the vacuum energy level and thus the ITO work function. The variations in the measured results are presumably caused by different surface coverage of Cl. It is thus clear that the performance enhancement of the OLEDs with a Cl$_2$ ICP etched ITO anode arises from a better energy level alignment at the ITO/CBP interface, leading to more efficient injection of holes into the light-emitting region.

Figure 11:
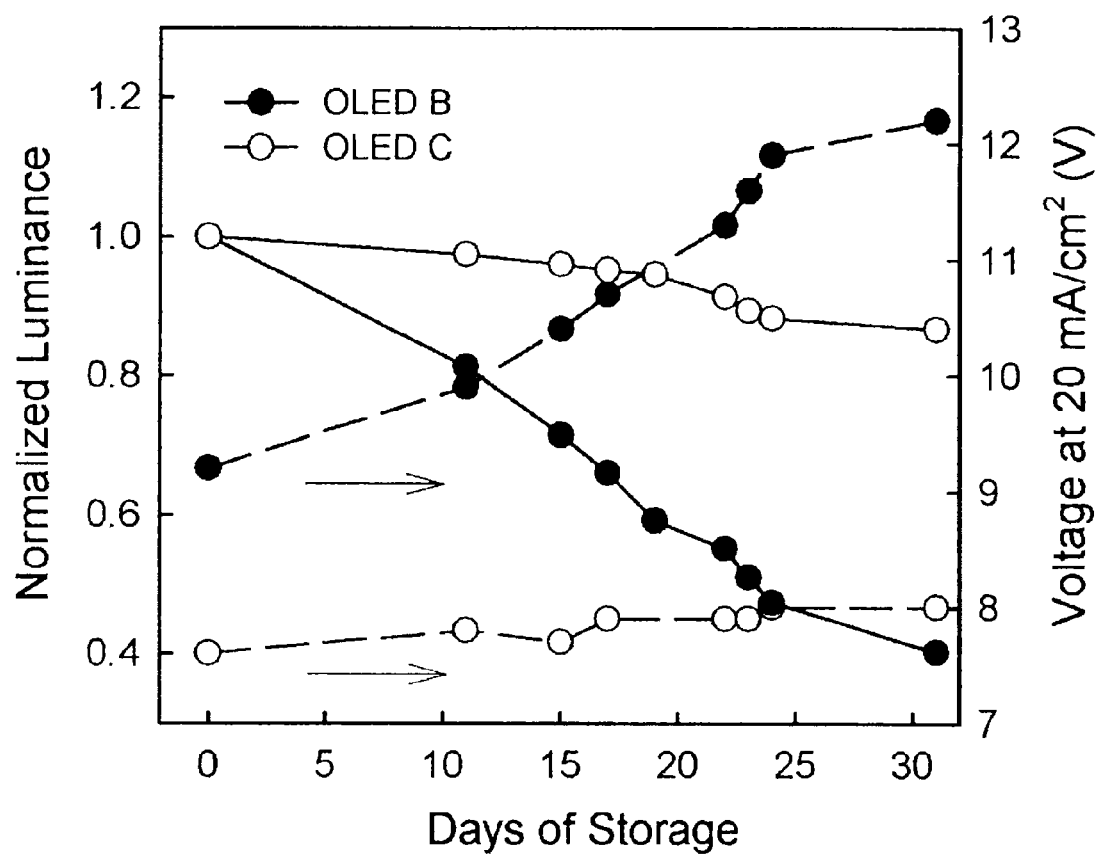
FIG. 11 is a graph that illustrates variations of the normalized luminance and operation voltage of OLED B (with $O_2$ plasma treated ITO) and OLED C (with $Cl_2$ ICP etched ITO) measured at about 20 mA/cm² with the days of storage.

The robustness of the OLED with Cl$_2$ ICP-etched ITO was evaluated in two different ways and compared with that of the OLED with O$_2$ plasma-treated ITO. First, the OLEDs were stored in glovebox and their characteristics were tested once every day. The variations of the luminance and voltage of OLED B and C at about 20 mA/cm$^2$ are shown in FIG. 11. After about 30 days of storage, the brightness of OLED B dropped by more than about 60%, and its voltage increased from about 9.3 V to 12.3 V. In contrast, OLED C exhibited much slower degradation, with only an about 13% decrease in luminance and an about 0.4 V increase in voltage. During this period, similar evolution of dark spots in these devices were observed. These findings suggest that plasma chlorination can significantly improve the OLED durability. The performance degradation seen in OLED C may be largely attributed to the formation of dark spots at the interface between the organic layer and cathode.

Figure 12:
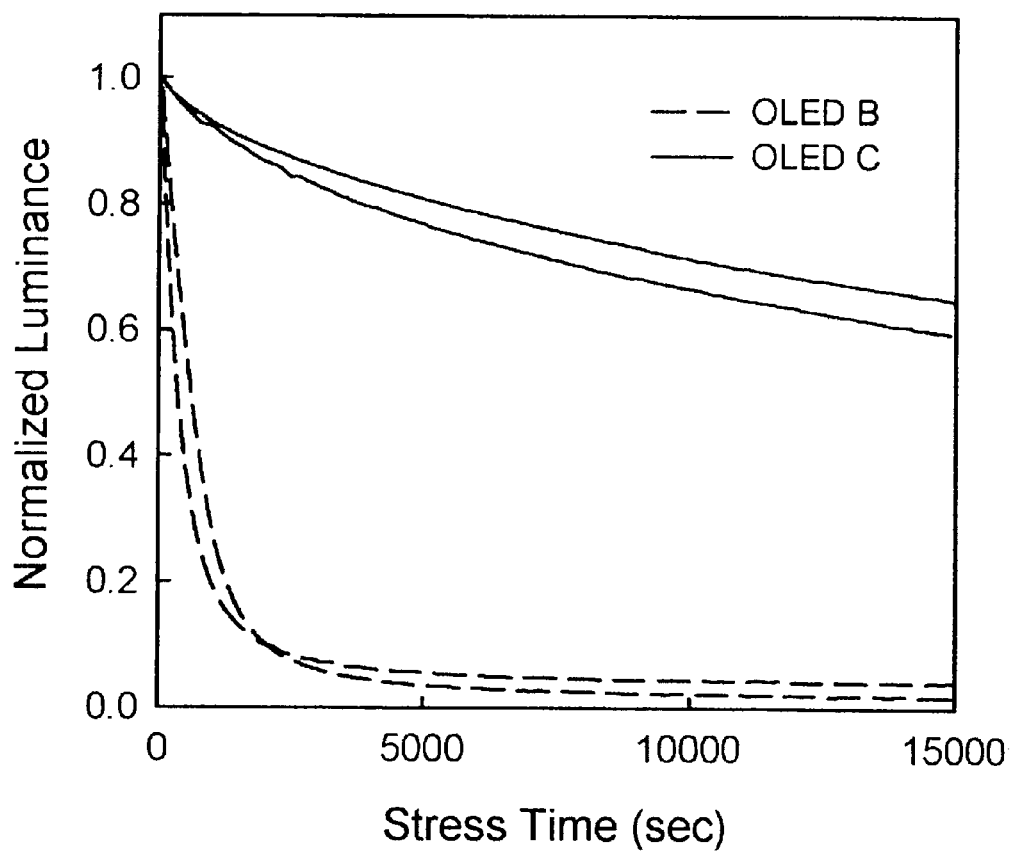
FIG. 12 is a graph that illustrates evolution of the normalized luminance of OLED B (with $O_2$ plasma treated ITO) and OLED C (with $Cl_2$ ICP etched ITO) under constant current stress at about 20 mA/cm².

Second, similar OLEDs were subjected to constant-current stressing at about 20 mA/cm$^2$ in air. The dependence of the normalized luminance of the OLEDs on the stressing time is plotted in FIG. 12. For OLED B, the optical power dropped dramatically during the first hour, by more than about 90%. A rapid increase in the operation voltage was seen during this process. Both parameters tended to stabilize as the device was stressed further. As seen, OLED C displayed gradual and much slower degradation. During the first hour, its EL decreased by only about 16% and the corresponding voltage increase was less than about 1 V. The half-life (defined as the time for the brightness to decline to 50% of its initial value) of this OLED was estimated to be about 60 times longer than that of OLED B. Such reliability improvement has also been observed in OLEDs with Cl$_2$ plasma-exposed ITO.[2] Before and after the stressing tests, there were no noticeable changes in the size and density of dark spots in all the stressed OLEDs.

The different stability and reliability of OLEDs with different pre-treatments of the ITO anode may be explained in two ways. The different aging rates of OLED B and C were probably caused by different rates of indium outdiffusion from ITO, which has been identified as an aging mechanism in OLEDs under operation.[5] Since Cl—In bonds are stronger than In—O bonds, Cl may immobilize indium atoms more effectively and suppress their migration into the organic structure. Alternatively, the result in FIG. 12 may be explained as follows. The initial operation voltage of OLED B is about 1.6 V higher than that of OLED C. The additional voltage in the former likely drops at the ITO/CBP interface, generating a large amount of joule heat, which would cause microstructural changes in amorphous CBP.[6] The induced defect states may act as carrier traps and nonradiative recombination centers, causing device degradation. Our study thus suggests that plasma chlorination creates a more stable ITO/organics interface than O$_2$ plasma treatment, leading to more reliable operation of the OLEDs.

Conclusions

In summary, a brief Cl$_2$ plasma etching can effectively raise the work function of ITO by forming a stable metal-Cl dipole layer. An increase in the work function by as much as about 1.0 eV compared to that of ITO treated with O$_2$ plasma was observed, leading to more efficient injection of holes into the light-emitting region of green phosphorescent OLEDs. At about 20 mA/cm$^2$, the OLEDs with a Cl$_2$ ICP-etched ITO anode had a brightness of about 1.4×10$^4$ cd/m$^2$ and a current efficiency of about 70 cd/A, which were about 40% higher compared to similar devices with O$_2$ plasma-treated ITO. In addition, Cl$_2$ plasma chlorination also led to a marked improvement of the device stability and reliability. The developed surface modification technique via simple plasma etching is compatible with industrial manufacturing processes of various organic electronics.

References (which are incorporated by reference for the corresponding discussion)

1. X. A. Cao, F. Ren, and S. J. Pearton, Critical Rev. Solid State Mat. Sci. 25, 279 (2000).
2. X. A. Cao and Y. Q. Zhang, Appl. Phys. Lett. 100, 183304 (2012)

3. K. Sun and J. Ouyang, Sol. Energy Mater. Sol. Cells 96, 238 (2010).
4. H. B. Andagana and X. A. Cao, JVST A 28, 189 (2010).
5. T. Lee, Z. Q. Gao, and L. S. Hung, Appl. Phys. Lett. 75, 1404 (1999).
6. C. Adachi, K. Nagai, and N. Tamoto, Appl. Phys. Lett. 66, 2679 (1995).

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±1%, ±2%, ±3%, ±4%, ±5%, ±6%, ±7%, ±8%, ±9%, or ±10%, or more of the numerical value(s) being modified. In an embodiment, the term "about" can include traditional rounding according to the numerical value. In addition, the phrase "about 'x' to 'y'" includes "about 'x' to about 'y'".

It should be emphasized that the above-described embodiments of the present disclosure are merely possible examples of implementations, and are merely set forth for a clear understanding of the principles of the disclosure. Many variations and modifications may be made to the above-described embodiments. All such modifications and variations are intended to be included herein within the scope of this disclosure and protected by the following claims.

Therefore, at least the following is claimed:

1. A method for producing an electrode for organic electronic devices comprising:
    treating a surface of a conductive layer by exposing the conductive layer to a chlorine based plasma, wherein the conductive layer is selected from the group consisting of: an indium containing alloy layer, a tin-containing alloy layer, and a combination thereof.

2. The method of claim 1, wherein the indium containing alloy layer is selected from the group consisting of: indium-tin-oxide, indium-zinc-oxide, and a combination thereof.

3. The method of claim 1, wherein the tin-containing alloy layer is selected from the group consisting of: indium-tin-oxide, zinc-tin-oxide, and a combination thereof.

4. The method of claim 1, wherein the chlorine based plasma is generated using chlorine-containing gas selected from the group consisting of: $Cl_2$, $BCl_3$, $CCl_4$, $SiCl_4$, $ClF_3$, $CClH_3$, $C_xCl_yF_z$, and any combination thereof.

5. The method of claim 1, wherein the plasma is selected from the group consisting of: high-pressure plasma, reactive-ion-beam plasma, inductively-coupled plasma, transmission coupled plasma, electron cyclotron resonance plasma, and a combination thereof.

6. The method of claim 1, wherein the surface treatment comprises exposing the conductive layer to a plasma with an average ion energy less than about 100 eV.

7. The method of claim 1, wherein the surface treatment comprises exposing the conductive layer to a plasma with an average ion energy less than about 50 eV.

8. The method of claim 1, wherein the surface treatment comprises etching the conductive layer in the chlorine based plasma for a time less than about 10 minutes.

9. A method of making an organic electronic device comprising:
    depositing a first conductive layer on to a substrate;
    treating the first conductive layer with a chlorine-based plasma, thereby increasing the work function of the first conductive layer by at least about 0.3 eV;
    depositing at least one organic layer over the first conductive layer; and
    depositing a second conductive layer over the at least one organic layer.

10. The method of claim 9, wherein the organic electronic device is selected from the group consisting of: an organic light-emitting diode (OLED), an organic solar cell, an organic photodetector, an organic laser diode, and a combination thereof.

11. The method of claim 9, wherein the conductive layer is selected from the group consisting of: Au, Pt, Ni, Cu, ZnO, $SnO_2$, indium tin oxide (ITO), indium zinc oxide (IZO), zinc tin oxide (ZTO), and a combination thereof.

12. The method of claim 9, wherein the first conductive layer is treated with the chlorine-based plasma for at least about 3 seconds.

13. The method of claim 9, further comprising etching the conductive layer in the chlorine based plasma for a time less than about 10 minutes.

14. An organic electronic device comprising an electrode comprising a conductive layer, wherein the conductive layer is chlorinated by treatment with a chlorine based plasma, and wherein a work function of the conductive layer is increased by at least about 0.3 eV.

15. The organic electronic device of claim 14, wherein the conductive layer is selected from the group consisting of: an indium containing alloy layer, a tin-containing alloy layer, and a combination thereof.

16. The organic electronic device of claim 15, wherein the indium containing alloy layer is selected from the group consisting of: indium-tin-oxide, indium-zinc-oxide, and a combination thereof, and the tin-containing alloy layer is selected from the group consisting of: indium-tin-oxide, zinc-tin-oxide, and a combination thereof.

17. The organic electronic device of claim 14, wherein the chlorine based plasma is generated using chlorine-containing gas selected from the group consisting of: $Cl_2$, $BCl_3$, $CCl_4$, $SiCl_4$, $ClF_3$, $CClH_3$, $C_xCl_yF_z$, and any combination thereof.

18. The organic electronic device of claim 14, wherein the conductive layer is chlorine plasma etched, and wherein the work function of the conductive layer is increased by about 1.0 eV.

19. The organic electronic device of claim 14, wherein the device is selected from the group consisting of: an organic light-emitting diode (OLED), an organic solar cell, an organic laser diode, an organic photodetector, and a combination thereof.

* * * * *